US00RE36894E

United States Patent [19]

Greenberg et al.

[11] E Patent Number: Re. 36,894

[45] Reissued Date of Patent: Oct. 3, 2000

[54] SEMICONDUCTOR PACKAGE WITH HIGH DENSITY I/O LEAD CONNECTION

[75] Inventors: Lawrence Arnold Greenberg; David Jacob Lando, both of Allentown, Pa.

[73] Assignee: Lucent Technologies Inc., Murray Hill, N.J.

[21] Appl. No.: 08/229,857

[22] Filed: Apr. 19, 1994

Related U.S. Patent Documents

Reissue of:

[64] Patent No.: 4,774,635
Issued: Sep. 27, 1988
Appl. No.: 06/866,931
Filed: May 27, 1986

U.S. Applications:

[63] Continuation of application No. 08/062,689, May 17, 1993, abandoned, which is a continuation of application No. 07/589,370, Sep. 25, 1990, abandoned.

[51] Int. Cl.[7] ..... H05K 7/20

[52] U.S. Cl. ..... 361/723

[58] Field of Search ..... 361/717–723

[56] References Cited

U.S. PATENT DOCUMENTS

| | | | |
|---|---|---|---|
| Re. 31,967 | 8/1985 | Burns | 430/314 |
| 4,371,912 | 2/1983 | Guzik | 361/417 |
| 4,480,013 | 10/1984 | Doi et al. | 428/616 |
| 4,498,122 | 2/1985 | Rainal | 361/414 |
| 4,578,697 | 3/1986 | Takemae | 357/75 |
| 4,631,820 | 12/1986 | Harada et al. | 361/401 |
| 4,801,765 | 1/1989 | Moyer et al. | 174/52.4 |

FOREIGN PATENT DOCUMENTS 58-122763 7/1983 Japan .

OTHER PUBLICATIONS

U.S. application No. 816,443; Moyer and Scholz, filed Jan. 6, 1986.

*Primary Examiner*—Michael J. Sherry
*Attorney, Agent, or Firm*—David L. Smith; Richard D. Laumann

[57] ABSTRACT

Disclosed is a semiconductor package which permits coupling of semiconductor bond pads to I/O leads where a high density of connections is needed. Conductive fingers backed by an insulating tape are bonded to the ends of the ringers on a lead frame. The tape fingers are electrically coupled to the bond pads on one major surface of the semiconductor chip by wire bonding. In one embodiment, the opposite major surface of the chip is bonded to a paddle on the lead frame through an aperture in the tape for maximum heat dissipation.

20 Claims, 4 Drawing Sheets

SEMICONDUCTOR PACKAGE WITH HIGH DENSITY I/O LEAD CONNECTION

Matter enclosed in heavy brackets [ ] appears in the original patent but forms no part of this reissue specification; matter printed in italics indicates the additions made by reissue.

*This reissue application is a continuation of reissue application Ser. No. 08/062,689, filed on May 17, 1993, now abandoned, which is a continuation of reissue application Ser. No. 07/589,370, filed on Sep. 25, 1990, now abandoned, which is a reissue application of U.S. Pat. No. 4,774,635 granted Sep. 27, 1988.*

BACKGROUND OF THE INVENTION

This invention relates to semiconductor device packages, and in particular to a package requiring a high density of connections from the semiconductor to external leads.

In standard semiconductor device packaging, the semiconductor chip is electrically connected to outside circuitry by means of a lead frame. The lead frame may be thought of as a solid metal picture frame with fingers radiating inward from either two opposing sides or from all four sides toward the geometric center of the frame. Also radiating inward from each of the four corners of the frame is a finger which terminates on a square or rectangular piece of metal, typically referred to as a paddle, which occupies a portion of the geometric center. One major surface of the chip is bonded to the paddle, and contact pads on the opposite surface are electrically coupled to the lead frame fingers by bonding conductive wires to the pads and fingers. The chip and a portion of the lead frame fingers are then encapsulated or molded in a material such as an epoxy or plastic molding compound, and the molded package body and lead frame fingers are cut from the frame. The lead frame fingers are then formed to provide a means of electrically connecting the package to the second level interconnection board, which is typically a printed circuit board. The severed fingers therefore constitute the I/O (Input/Output) leads for the semiconductor chip.

This standard packaging scheme generally has been satisfactory. However, a problem exists where a high density of connections is required between the chip contact pads and the lead frame fingers due to a great number of such contacts and/or smaller than standard chip sizes. In such cases, it is difficult to fabricate the fingers sufficiently close together to accommodate the high density of interconnections. For example, lead frame fingers cannot usually be made with less than a 16 mil pitch (the distance between the center of two adjacent fingers). In order to provide connection to a chip with 50 pads on a chip side having standard dimensions (320 mils), the ends of the fingers can only be brought to within approximately 240 mils of the chip due to the limit on pitch. This tends to cause sagging and shorting of the wires between the pads and fingers.

One solution to the problem of high density I/O connections involves use of multi-level ceramic or glass packages (see, e.g., U.S. Pat. No. 4,498,122 issued to Rainal). While adequate, such packages are fairly expensive. One possible alternative which has been proposed recently is to provide a multi-level lead frame structure for connecting the chip. (See U.S. patent application of Moyer and Scholz, Ser. No. 816,443, filed Jan. 6, 1986, *now U.S. Pat. No. 4,801,765,* and assigned to the present assignee.) It is desirable to provide a further alternative package for high density connections.

A further problem which exists in many semiconductor packages is inadequate heat removal from the chip during operation. This is more troublesome as chips become more complex and are required to do more functions. It is, therefore, also desirable to provide a semiconductor package with efficient heat dissipation.

It is, therefore, an object of the invention to provide a semiconductor device package with high density I/O lead connections. It is also an object of the invention to provide such a package with maximized heat dissipation.

SUMMARY OF THE INVENTION

These and other objects are achieved in accordance with the invention which is a semiconductor device package comprising a mounting pad and a plurality of first conductive fingers with one end of each in close proximity to the pad and defining a first gap therebetween. A plurality of second conductive fingers, which are formed on an insulating film, extend over the gap with one end of said second conductive fingers bonded to corresponding first conductive fingers and the opposite end of the second conductive fingers terminating in close lateral proximity to the pad to define a second gap therebetween which is less than the first gap.

BRIEF DESCRIPTION OF THE DRAWING

These and other features of the invention will be discussed in detail in the following description. In the drawing.

It will be appreciated that for purposes of illustration, these figures are not necessarily drawn to scale.

DETAILED DESCRIPTION

The basic principles of the invention will be described with reference to the embodiment shown in various stages in FIGS. 1–3.

Figure 1:
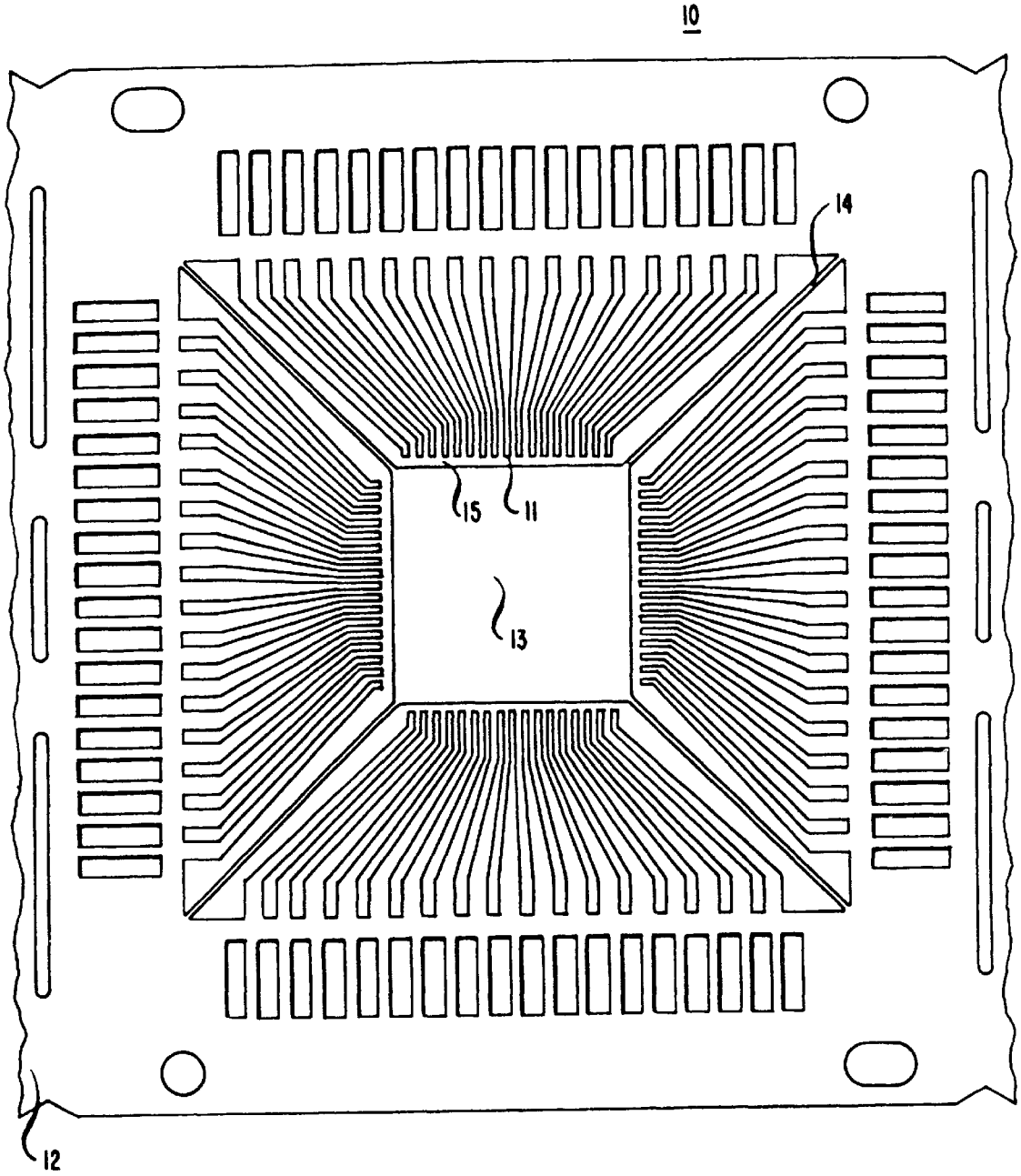
FIG. 1 is a plan view of a semiconductor device package at one stage of fabrication in accordance with one embodiment of the invention.
Figure 2:
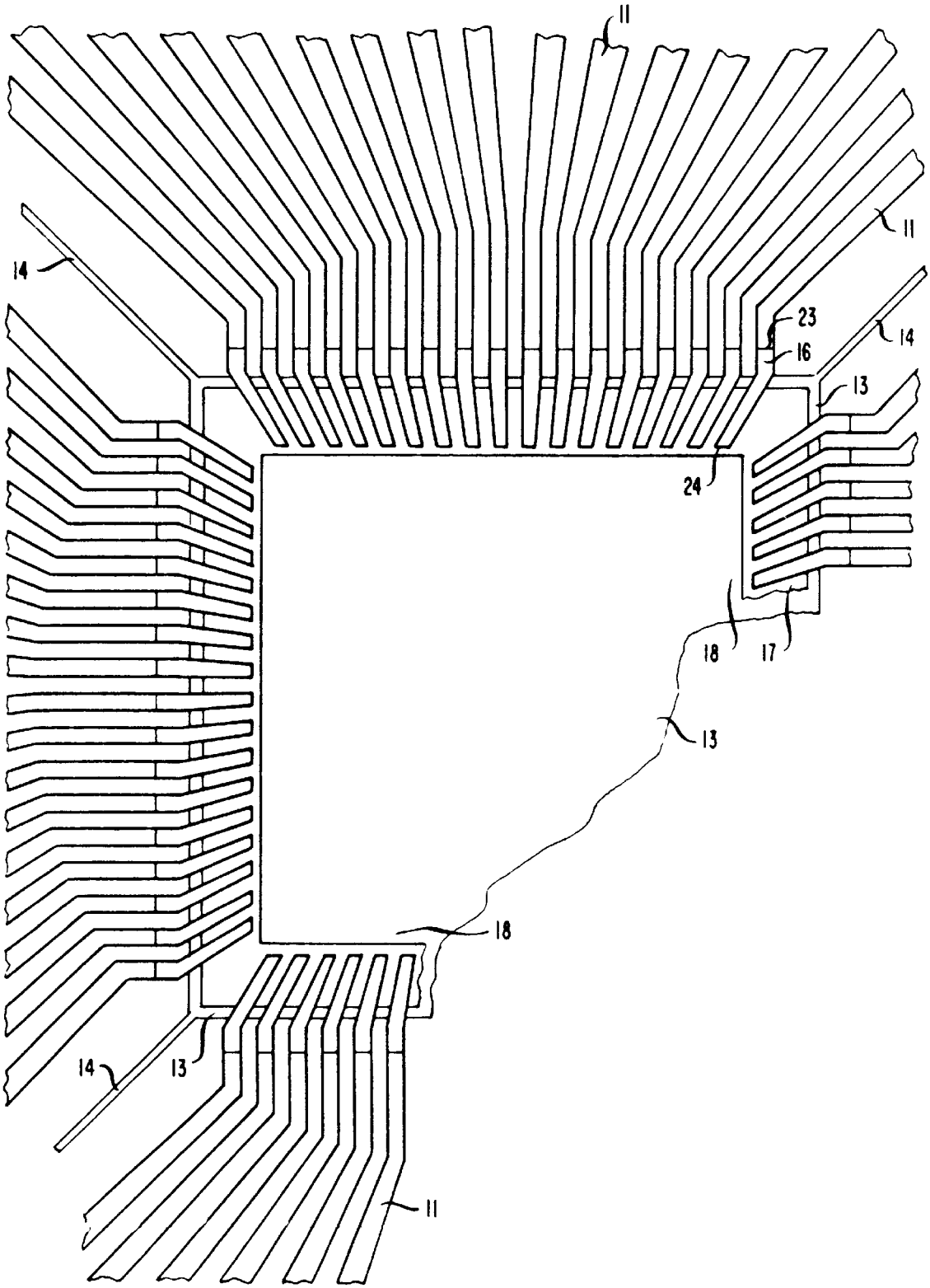
FIGS. 2 and 3 are magnified portions of a package, partially broken away, during further stages of fabrication in accordance with the same embodiment.

Packaging of a semiconductor device starts with a standard type of lead frame such as illustrated in FIG. 1. The lead frame, 10, includes a first plurality of conductive fingers, such as 11, radiating inward from the solid picture-frame-like perimeter, 12. In this example, the fingers are present on all four sides of the perimeter, but may also be present on any lesser number of sides. The lead frame also includes a paddle, 13, located at the center, with a second plurality of conductive fingers, such as 14, coupled to the paddle and extending to the four corners of the perimeter. A gap, such as 15, is formed between the first plurality of conductive fingers (11) and the paddle on all four sides of the paddle. The paddle, fingers and perimeter are typically formed from a sheet of metal such as alloyed copper.

For a typical high-density interconnection package, the frame includes a total of 200 fingers, such as 11, extending to each side of the paddle (50 on each side). At their narrowest point, the fingers are approximately 8 mils wide with a spacing of 8 mils between each finger on a side (thus producing a 16 mil pitch). The paddle is typically approximately 350 mils×350 mils. The gap, 15, between the paddle and the fingers is approximately 10 mils. It would be desirable to bring the conductive fingers closer to the semiconductor device to be bonded to the paddle, but it is difficult to do this since the fingers cannot generally be made narrower than 8 mils. This width limitation is due primarily to the fact that a lead frame is etched from a sheet of metal approximately 8 mils thick and the etching features are limited to the thickness. (The lead frame can also be stamped from sheet metal, but similar dimensional limitations apply.)

Therefore, in order to provide for the high density interconnection, an additional element is provided to bridge the gap between the lead frame and paddle. As illustrated in FIG. 2, which is a magnified view of the central portions of the lead frame, this element comprises a third plurality of conductive fingers, such as 16, formed on an insulating layer 17. These conductive fingers correspond in number and position to the conductive fingers of the lead frame and have their outer ends (23) extending approximately 10 mils beyond the insulating layer and their inner ends (24) extending approximately 10 mils from the sides of a hole, 18, formed in the insulating layer. (It should be appreciated that the insulating layer, 17, could extend all the way out to the outer ends, 23, of the fingers, in which case the fingers would be bonded to the underside of the lead frame fingers. The inner ends, 24, of the conductive fingers could also extend right up to the sides of the hole, 18. It will also be appreciated that, although the insulating layer, 17, is shown as slightly smaller than the paddle, it could be equal to or greater than the size of the paddle). The portion of the paddle, 13, exposed by the hole, 18, forms a mounting pad for a semiconductor chip to be described.

In this example, the additional element was formed from a wire-bondable tape which was supplied by 3M Company for Tape Automated Bonding (TAB) packages. The conductive fingers were made of 99.9% copper plated to a thickness of approximately 2 mils and each had a width of 8 mils and a separation between fingers of approximately 2 mils to produce a pitch of 10 mils. The insulating layer, 17, which provided mechanical backing for the fingers, was made of Kapton and was approximately 3 mils thick. The standard tape was modified by punching the hole, 18, in the insulator 17 at the center. The hole measured approximately 250 mils×250 mils.

The insulating layer, 17, was bonded to the underlying paddle, 13, and the conductive fingers on the insulator (e.g., 16) were bonded to their corresponding fingers of the lead frame (e.g., 11) by thermocompression bonding. This typically involves heating the structure at a temperature of approximately 550 degrees C. for 0.2 seconds while applying pressure of approximately 40 PSI.

Figure 3:
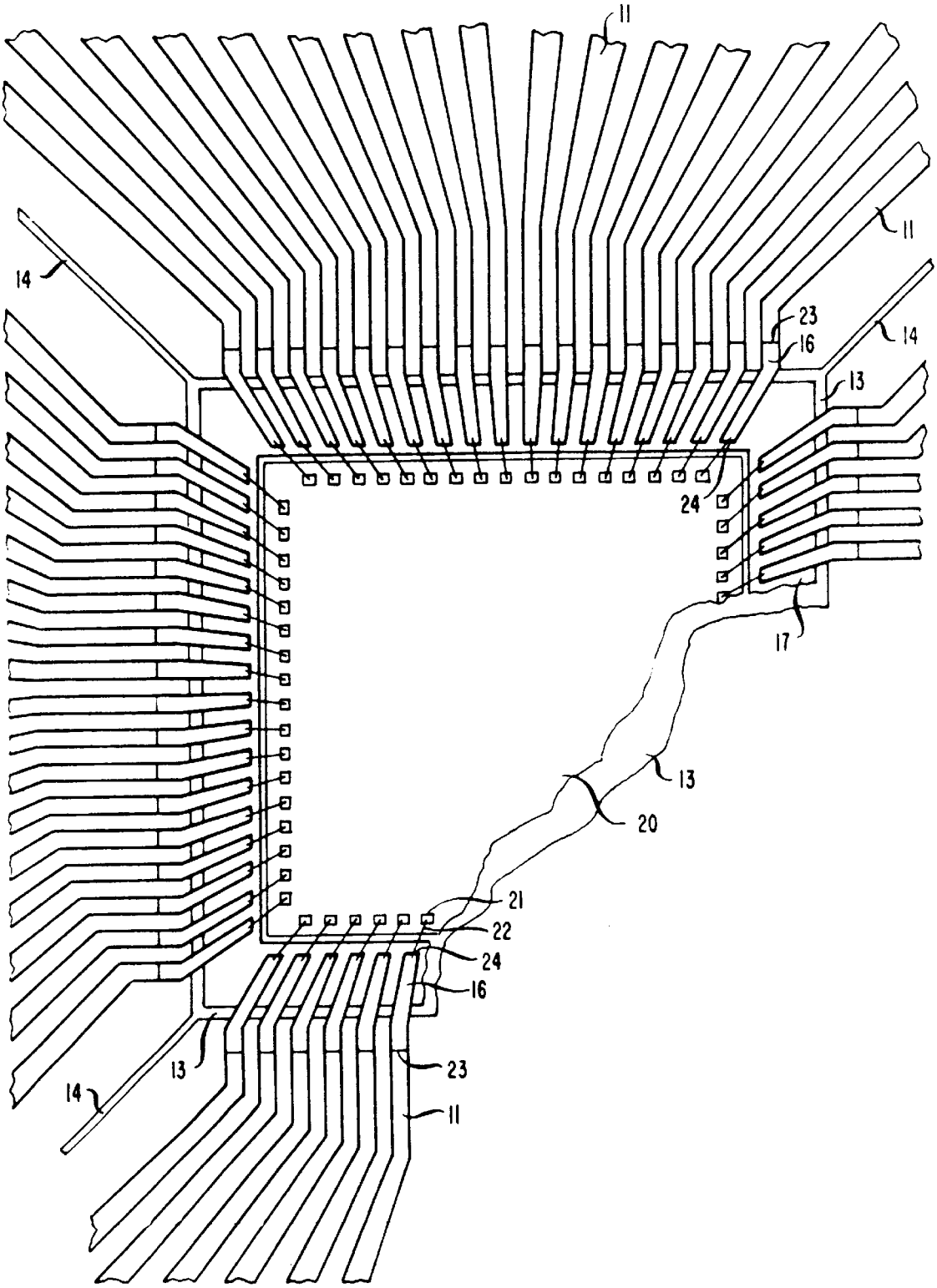
Figure 4:
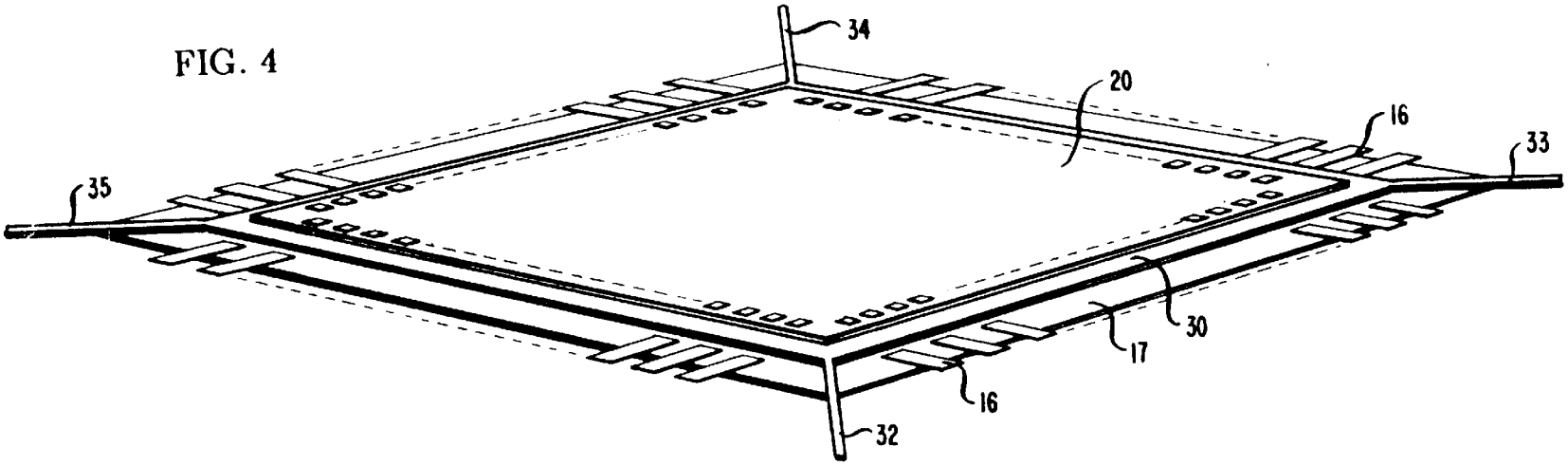
FIG. 4 is a perspective view of a portion of a semiconductor package in accordance with a further embodiment of the invention.

As illustrated in FIG. 3, which is also a magnified view of the central portion of the lead frame, the semiconductor chip, 20, was placed in the hole 18 of the insulating layer 17 so that the back surface of the chip was in mechanical contact with the mounting portion of the underlying paddle, 13. The chip was bonded to the paddle by conductive epoxy. The paddle and connected fingers, 14, therefore provided a ground connection to the back surface of the chip. Further, the paddle provided an excellent heat sink during the operation of the chip. In particular, the calculated heat dissipation for a 148 pin package assuming natural convection cooling was approximately 32 degrees per watt for this embodiment, which was approximately 3 degrees per watt better than when the chip was bonded to a conductive pad on the tape (FIG. 4). The chip measured approximately 190 mils×200 mils.

As also illustrated in FIG. 3, the front surface of the chip, 20, included a plurality of bonding pads, such as 21, on its periphery. These pads were made of aluminum with a thickness of approximately 1 micron and measured approximately 4 mils×4 mils. The pads were also spaced approximately 4 mils apart. Electrical connection between each of these pads and their corresponding conductive fingers on the insulating layer was provided by wires (e.g., 22) attached to the pad and finger by standard wire bonding techniques. This involved ball bonding one end of a wire to a pad and then wedge bonding the other end of the wire to the conductive finger while heating to a temperature of 200 degrees C.

It will be appreciated, therefore, that the smaller pitch of the conductive fingers (e.g., 16) formed on the insulating layer 17 permits the fingers to be brought closer to the semiconductor device, 20, for a high density interconnect package. This allows a relatively short span for the wires (e.g., 22) to traverse and thereby reduces the possibility of failures in the wire connections. In general, it is desirable to have wires spanning less than 150 mils distance. In this example, the wires were approximately 70 mils long. Further, since the device is bonded directly to the underlying paddle, 13, heat dissipation is maximized.

While the embodiment of FIG. 3 appears preferable in terms of maximum heat dissipation, the embodiment illustrated in FIG. 4, where corresponding elements are similarly numbered, may also be useful. (For the sake of clarity, the lead frame is not shown in FIG. 4.) It will be noted that the major distinction in the embodiment of FIG. 4 is that the device, 20, is bonded to a pad, 30, which is formed on the insulating layer 17 at the center of the conductive finger pattern. Tabs 32–33 also extend from the corners of the pad 30 out beyond the ends of the insulator 17. The layer 17 is bonded to the paddle (13 of FIG. 2) and the fingers, 16, are bonded to the lead frame fingers (11 of FIG. 2) as before. In addition, the Tabs 32–35 are thermocompression bonded to corresponding fingers (14 of FIG. 2) coupled to the paddle. Ground connection to the device is, therefore, provided through pad 30 and tabs 32–35 rather than through the paddle 13. In fact, in this embodiment the paddle can be dispensed with and ground connections made by wirebonding or thermocompression bonding the tabs 32–35 to appropriate conductors of the lead frame. In this example, the pad 30 was made of copper, with a thin layer (approximately 30 micro-inches) of gold on the surface. The pad was approximately 220 mils long, 220 mils wide and 2 mils thick.

Figure 5:
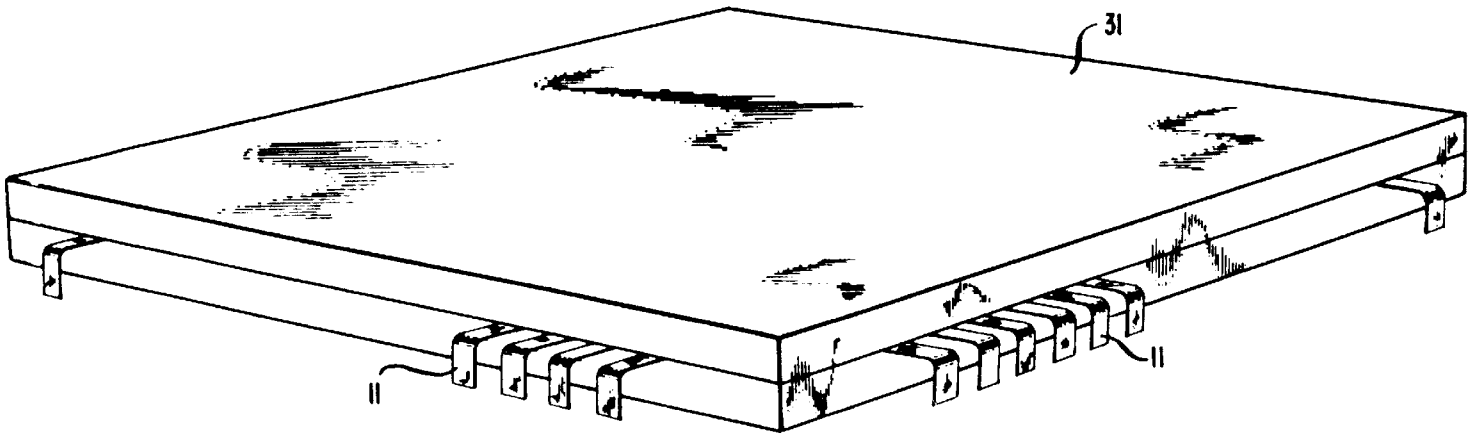
FIG. 5 is a perspective view of the semiconductor package in a final stage of manufacture.

In the final fabrication steps, the structure of FIGS. 3 or 4 is encapsulated with a standard material, such as room temperature vulcanizing silicone rubber, which covered the device, conductive fingers on the insulator, the paddle, and at least a portion of the conductive fingers of the lead frame. After a standard molding operation, the fingers of the lead frame are then cut from the perimeter 12 and appropriately formed so that each would comprise an I/O lead for the package suitable for connection to printed circuit boards or the like. A typical final package is shown in a perspective view in FIG. 5 with the molding shown as element 31.

The package described herein appears most advantageous for semiconductor devices requiring a high number of I/O leads, i.e., at least 15 on a side. The invention is also advantageous where it is desired to reduce the size of the chip, for example to less than 100 mils on a side, so that a higher density of interconnection is required. In general, the invention is most advantageous where a pitch of less than 16 mils is desirable for the ends of the conductive fingers nearest the chip so that wire spans of less than 150 mils can be achieved.

Various additional modifications of the invention as described herein will become apparent to those skilled in the art. All such variations which basically rely on the teachings through which the invention has advanced the art are properly considered within the scope of the invention.

What is claimed is:

1. A semiconductor device package comprising:

a mounting pad;

a plurality of first conductive lead frame fingers with one end of each in close lateral proximity to the pad and defining a first gap therebetween; and a plurality of second conductive fingers formed on an insulating tape layer and extending over the *first* gap, one end of said second conductive fingers being bonded to corresponding first conductive fingers and the opposite end of the second conductive fingers terminating in close lateral proximity to the pad to define a second gap therebetween which is less than the first gap.

2. The package according to claim 1 further comprising a semiconductor device with two major surfaces, said device having one major surface bonded to the mounting pad and the opposite major surface including a plurality of bonding pads.

3. The package according to claim 2 further comprising electrical wire connections between the bonding pads on the device and corresponding second conductive fingers.

4. The package according to claim 3 wherein the length of the wire is less than 150 mils.

5. The package according to claim 3 wherein the number of electrical connections between the pads and second conductive fingers is at least 15 per side.

6. The package according to claim 1 wherein the pitch of the second conductive fingers is less than 16 mils.

7. The package according to claim 1[wherein] *, further comprising* a conductive [paddle is] *paddle, the conductive paddle being* formed on a plane with the first conductive fingers [and] *,* the insulating layer [is] mounted on the paddle.

8. The package according to claim 7 wherein the insulating layer includes a hole therein so that the mounting pad is defined by the portion of the underlying paddle exposed by said hole.

9. The package according to claim 1 wherein the mounting pad is formed on the same surface of the insulating layer as the second conductive fingers.

10. The package according to claim 1 wherein the mounting pad has four sides and there are at least 15 conductive fingers in close proximity to each side.

*11. A semiconductor device package comprising;*

*a mounting pad;*

*a plurality of first conductive lead frame fingers with one end of each in close lateral proximity to the pad and defining a first gap therebetween;*

*and a plurality of second conductive fingers formed on an insulating organic dielectric layer and extending over the first gap, one end of said second conductive fingers being bonded to corresponding first conductive fingers and the opposite end of the second conductive fingers terminating in close lateral proximity to the pad to define a second gap therebetween which is less than the first gap.*

*12. The package according to claim 11 further comprising a semiconductor device with two major surfaces, said device having one major surface bonded to the mounting pad and the opposite major surface including a plurality of bonding pads.*

*13. The package according to claim 12 further comprising electrical wire connections between the bonding pads on the device and corresponding second conductive fingers.*

*14. The package according to claim 13 wherein the length of the wire is less than 150 mils.*

*15. The package according to claim 13 wherein the number of electrical connections between the pads and second conductive fingers is at least 15 per side.*

*16. The package according to claim 11 wherein the pitch of the second conductive fingers is less than 16 mils.*

*17. The package according to claim 11, further comprising a conductive paddle, the conductive paddle being formed on a plane with the first conductive fingers, the insulating layer mounted on the paddle.*

*18. The package according to claim 17 wherein the insulating layer includes a hole therein so that the mounting pad is defined by the portion of the underlying paddle exposed by said hole.*

*19. The package according to claim 11 wherein the mounting pad is formed on the same surface of the insulating layer as the second conductive fingers.*

*20. The package according to claim 11 mounting pad has four sides and there are at least 15 conductive fingers in close proximity to each side.*

* * * * *